United States Patent
Jin et al.

(10) Patent No.: US 11,460,341 B2
(45) Date of Patent: Oct. 4, 2022

(54) WAFER SCALE ULTRASONIC SENSOR ASSEMBLY AND METHOD FOR MANUFACTURING THE SAME

(71) Applicants: J-METRICS TECHNOLOGY Co., Ltd., Taipei (TW); Peking University Shenzhen Graduate School, Shenzhen (CN)

(72) Inventors: Yu-Feng Jin, Shenzhen (CN); Sheng-Lin Ma, Shenzhen (CN); Yi-Hsiang Chiu, Taipei (TW); Hung-Ping Lee, Taipei (TW); Dan Gong, Shenzhen (CN)

(73) Assignees: j-Metrics Technology Co., Ltd., Taipei (TW); Peking University Shenzhen Graduate School, Shenzhen (CN)

( * ) Notice: Subject to any disclaimer, the term of this patent is extended or adjusted under 35 U.S.C. 154(b) by 793 days.

(21) Appl. No.: 16/429,801

(22) Filed: Jun. 3, 2019

(65) Prior Publication Data
US 2020/0191646 A1 Jun. 18, 2020

(30) Foreign Application Priority Data
Dec. 14, 2018 (CN) .......................... 201811530871.9

(51) Int. Cl.
*G01H 11/08* (2006.01)
*B06B 1/06* (2006.01)
(Continued)

(52) U.S. Cl.
CPC ........... *G01H 11/08* (2013.01); *B06B 1/0207* (2013.01); *B06B 1/0622* (2013.01); *B06B 3/00* (2013.01);
(Continued)

(58) Field of Classification Search
CPC ..... H01L 41/04; H01L 41/047; H01L 41/053; H01L 41/0533; H01L 41/08; H01L 41/22;
(Continued)

(56) References Cited

U.S. PATENT DOCUMENTS 10,866,619 B1 * 12/2020 Bushnell ................. G06F 3/011
2015/0102829 A1 * 4/2015 Son ...................... H01L 23/3121
324/692

(Continued)

*Primary Examiner* — Eduardo A Rodela
(74) *Attorney, Agent, or Firm* — Muncy, Geissler, Olds & Lowe, P.C.

(57) ABSTRACT

A wafer scale ultrasonic sensor assembly includes a wafer substrate, an ultrasonic element, first and second protective layers, conductive wires, a transmitting material, an ASIC, a conductive bump, and a soldering portion. The wafer substrate includes a via. The ultrasonic element is exposed to the via. The conductive wires are on the first protective layer and connected to the ultrasonic element. The second protective layer covers the conductive wires, and the second protective layer has an opening corresponding to the ultrasonic element. The transmitting material contacts the ultrasonic element. The ASIC is connected to the wafer substrate, so that the via forms a space between the ASIC and the ultrasonic element. The conductive pillar is in a via defined through the ASIC, the wafer substrate, and the first protective layer, and the conducive pillar is respectively connected to the conductive wires and the soldering portion.

20 Claims, 17 Drawing Sheets

(51) Int. Cl.
*B06B 3/00* (2006.01)
*H01L 41/04* (2006.01)
*H01L 41/047* (2006.01)
*H01L 41/053* (2006.01)
*H01L 41/083* (2006.01)
*H01L 41/08* (2006.01)
*H01L 41/23* (2013.01)
*H01L 41/277* (2013.01)
*H01L 41/293* (2013.01)
*B06B 1/02* (2006.01)
*H01L 41/311* (2013.01)
*G06V 40/13* (2022.01)

(52) U.S. Cl.
CPC ........ *H01L 41/042* (2013.01); *H01L 41/0472* (2013.01); *H01L 41/0475* (2013.01); *H01L 41/0533* (2013.01); *H01L 41/083* (2013.01); *H01L 41/0825* (2013.01); *H01L 41/23* (2013.01); *H01L 41/277* (2013.01); *H01L 41/293* (2013.01); *H01L 41/311* (2013.01); *B06B 2201/70* (2013.01); *G06V 40/1306* (2022.01)

(58) Field of Classification Search
CPC ......... H01L 41/23; H01L 41/25; H01L 41/27; H01L 41/277; H01L 41/29; H01L 41/31; H01L 41/311; H01L 41/33; H01L 41/331; H01L 41/332; H01L 41/337; H01L 41/47; H01L 25/16; H01L 25/18; H01L 25/50; H01L 23/12; H01L 23/147; H01L 23/31; H01L 23/3107; H01L 23/315; H01L 23/49827; H01L 2224/80893; H01L 41/042; H01L 41/0472; H01L 41/0475; H01L 41/0825; H01L 41/083; H01L 41/293; G01H 11/08; B06B 1/0207; B06B 1/0622; B06B 3/00; B06B 2201/70; G06V 40/1306; G06V 40/12; G06V 40/13
See application file for complete search history.

(56) References Cited

U.S. PATENT DOCUMENTS

| | | | |
|---|---|---|---|
| 2015/0241393 A1* | 8/2015 | Ganti | G06V 40/1306 |
| | | | 73/589 |
| 2017/0059699 A1* | 3/2017 | Mathe | G01S 7/52079 |
| 2017/0364726 A1* | 12/2017 | Buchan | H01L 41/047 |
| 2018/0196982 A1* | 7/2018 | Panchawagh | G06V 40/1353 |
| 2019/0080132 A1* | 3/2019 | Jin | H01L 41/25 |
| 2019/0354238 A1* | 11/2019 | Akhbari | G06N 3/0445 |
| 2020/0179979 A1* | 6/2020 | Jin | H01L 41/0831 |
| 2020/0380232 A1* | 12/2020 | Yoon | G06V 40/1306 |
| 2021/0003534 A1* | 1/2021 | Lal | G01N 29/2437 |

* cited by examiner

WAFER SCALE ULTRASONIC SENSOR ASSEMBLY AND METHOD FOR MANUFACTURING THE SAME

CROSS-REFERENCE TO RELATED APPLICATION

This non-provisional application claims priority under 35 U.S.C. § 119(a) to Patent Application No. 201811530871.9 filed in China, P.R.C. on Dec. 14, 2018, the entire contents of which are hereby incorporated by reference.

BACKGROUND

Technical Field

The instant disclosure relates to ultrasonic transmission, in particular, to a wafer scale ultrasonic sensor assembly and method for manufacturing the same.

Related Art

Smart electronic devices like mobile phones, notebook computers, and tablets become important tools in our daily life. People are used to store important or personal information in the smart electronic devices. In order to prevent the information from getting lost or being stolen, smart electronic devices are equipped with fingerprint recognition functions to identify and recognize the users.

In a fingerprint recognition technology applied to smart electronic devices and known to the inventor(s), the ultrasonic element sends the ultrasonic signals to the finger and receives the ultrasonic signals reflected by the peaks and valleys of the fingerprint, so that the fingerprint can be recognized according to the amplitudes of the reflected ultrasonic signals. However, the ultrasonic signals of the ultrasonic element may be transmitted to an area not in contact with the finger, and the reflected ultrasonic signals received by the ultrasonic element are not definitely reflected by the finger. As a result, the fingerprint recognition accuracy of the fingerprint recognition technology known to the inventor is rather lower.

SUMMARY

In view of this, in one embodiment, a wafer scale ultrasonic sensor assembly is provided. The wafer scale ultrasonic sensor assembly comprises a wafer substrate, an ultrasonic element, a first protection layer, a first conductive wire, a second conductive wire, a second protection layer, a transmitting material, an application-specific integrated circuit chip (hereafter, ASIC), a conductive pillar, and a soldering portion.

The wafer substrate comprises a through groove penetrated through a first surface of the wafer substrate and a second surface of the wafer substrate, and the first surface is opposite to the second surface. The ultrasonic element is on the first surface of the wafer substrate, and the ultrasonic element has an upper surface and a lower surface. The lower surface of the ultrasonic element is exposed from the through groove. The first protection layer is on the first surface of the wafer substrate and surrounding the ultrasonic element. The first conductive wire and the second conductive wire are on the first protection layer and respectively connected to the upper surface of the ultrasonic element. The second protection layer covers the first conductive wire and the second conductive wire. The second protection layer has an opening, and the upper surface of the ultrasonic element corresponds to the opening. The transmitting material is in the opening and contacting the upper surface of the ultrasonic element. The ASIC comprises a connection surface and a bottom surface opposite to the connection surface. The connection surface is connected to the second surface of the wafer substrate. The via has a space between the connection surface of the ASIC and the lower surface of the ultrasonic element. The conductive pillar is in a via defined through the ASIC, the wafer substrate, and the first protection layer. The conductive pillar is connected to the first conductive wire or the second conductive wire. The soldering portion is on the bottom surface of the ASIC, and the soldering portion is connected to the conductive pillar.

In one or some embodiments, the connection surface of the ASIC and the second surface of the wafer substrate are connected with each other directly through anodizing.

In one or some embodiments, the ultrasonic element comprises a first piezoelectric layer, a first electrode, a second piezoelectric layer, and a second electrode. The first piezoelectric layer, the first electrode, the second piezoelectric layer, and the second electrode are stacked on the wafer substrate sequentially. The second piezoelectric layer and the second electrode do not cover the first electrode completely. The transmitting material contacts the second electrode. The first electrode is connected to the first conductive wire, and the second electrode is connected to the second conductive wire.

In one or some embodiments, the ultrasonic element comprises a first ultrasonic unit and a second ultrasonic unit. The first ultrasonic unit comprises a first piezoelectric layer and a first electrode. The first piezoelectric layer is on the wafer substrate. The first piezoelectric layer and the first protection layer have a first contact hole, so that the first piezoelectric layer communicates with the first protection layer through the first contact hole. The first electrode is enclosed by the first piezoelectric layer, and a portion of the first conductive wire is in the first contact hole and connected to the first electrode. The second ultrasonic unit is not overlapped with the first ultrasonic unit in a direction perpendicular to the first surface of the wafer substrate. The second ultrasonic unit comprises a second piezoelectric layer, a second circuit pattern layer, and a second electrode. The second piezoelectric layer is on the wafer substrate, and the first piezoelectric layer and the second piezoelectric layer are the same layer and separated from each other. The second circuit pattern layer is enclosed by the second piezoelectric layer, the second circuit pattern layer and the first electrode are the same layer and separated from each other, and the second electrode is on the second piezoelectric layer. The first protection layer has a second contact hole communicating with the opening. A portion of the second conductive wire is in the second contact hole and connected to the second electrode, and a portion of the transmitting material is in the second contact hole and contacting the second electrode.

In one or some embodiments, the ASIC further comprises a plurality of connection pads on the connection surface of the ASIC. Moreover, the via is defined through one of the connection pads connected to the conductive pillar.

In one or some embodiments, the transmitting material is polydimethylsiloxane.

A method for manufacturing wafer scale ultrasonic sensor assembly is also provided. The method comprises an ultrasonic element forming step, a first protection layer forming step, a wire connecting step, a second protection layer forming step, an opening forming step, a removing step, a connecting step, a via forming step, a via filling step, a soldering portion forming step, and a transmitting material filling step.

The ultrasonic element forming step comprises forming an ultrasonic element on a first surface of a wafer substrate, where the ultrasonic element comprises a first electrode and a second electrode not connected to the first electrode. The first protection layer forming step comprises forming a first protection layer on an upper surface of the ultrasonic element and the first surface of the wafer substrate, where the first protection layer has a first contact hole and a second contact hole, a portion of the first electrode is exposed from the first contact hole, and a portion of the second electrode is exposed from the second contact hole. The wire connecting step comprises forming a first conductive wire and a second conductive wire, where the first conductive wire and the second conductive wire are on the first protection layer, portions of the first conductive wire are in the first contact hole and connected to the first electrode of the ultrasonic element, and portions of the second conductive wire are in the second contact hole and connected to the second electrode of the ultrasonic element.

The second protection layer forming step comprises forming a second protection layer to cover the first conductive wire and the second conductive wire. The opening forming step comprises forming an opening on the second protection layer, where the opening at least exposes a portion of the second electrode. The removing step comprises removing a portion of the wafer substrate to form a through groove defined through the first surface and a second surface of the wafer substrate opposite to the first surface of the wafer substrate, so that a lower surface of the ultrasonic element is exposed from the through groove. The connecting step comprises connecting a connection surface of an ASIC and the second surface of the wafer substrate through anodizing, so that the through groove has a space between the connection surface and the lower surface of the ultrasonic element. The via forming step comprises forming a via defined through the ASIC, the wafer substrate, and the first protection layer. The via filling step comprises filling a conductive material in the via to form a conductive pillar, where the conductive pillar is connected to the first conductive wire or the second conductive wire. The soldering portion forming step comprises forming a soldering portion on a bottom surface of the ASIC, where a position of the soldering portion corresponds to a position of the conductive pillar, and the soldering portion is connected to the conductive pillar. The transmitting material filling step comprises filling a transmitting material in the opening, where the transmitting material contacts an upper surface of the ultrasonic element.

In one or some embodiments, after the opening forming step, the method further comprises a loading plate covering step. The loading plate covering step comprises covering a loading plate on the second protection layer and the opening to shield the opening. Moreover, after the soldering portion forming step, the method further comprises a loading plate removing step. The loading plate removing step comprises removing the loading plate to expose the opening.

In one or some embodiments, the ultrasonic element forming step comprises forming a first piezoelectric layer, a first electrode, a second piezoelectric layer, and a second electrode on the wafer substrate sequentially; and removing a portion of the first piezoelectric layer, a portion of the first electrode, a portion of the second piezoelectric layer, and a portion of the second electrode, where the second piezoelectric layer and the second electrode do not cover portions of the upper surface of the first electrode. The opening forming step, the opening is further defined through the first protection layer.

In some other embodiments, the ultrasonic element forming step comprises forming a first piezoelectric material layer and a first electrode material layer on the wafer substrate sequentially; patterning the first piezoelectric material layer and the first electrode material layer to form a first bottom piezoelectric layer, a second bottom piezoelectric layer, a first electrode, and a second circuit pattern layer, where the first bottom piezoelectric layer and the second bottom piezoelectric layer are separated from each other, the first electrode is stacked on the first bottom piezoelectric layer, and the second circuit pattern layer is stacked on the second bottom piezoelectric layer; forming a second piezoelectric material layer and a second electrode material layer on the first electrode and the second circuit pattern layer sequentially; and patterning the second piezoelectric material layer and the second electrode material layer to form a first piezoelectric layer, a second piezoelectric layer, and a second electrode, where the first piezoelectric layer and the second piezoelectric layer are separated from each other, the second electrode is formed on the second piezoelectric layer, wherein the first electrode is enclosed by the first piezoelectric layer, and the second circuit pattern layer is enclosed by the second piezoelectric layer. Furthermore, the first protection layer forming step further comprise forming a first protection material layer on the first piezoelectric layer, the second piezoelectric layer, and the second electrode; and forming the first contact hole and the second contact hole on the first protection material layer to convert the first protection material layer into the first protection layer, where the first protection layer comprises the first contact hole and the second contact hole, the first contact hole is defined through the first protection layer and the first piezoelectric layer, so that a portion of the first electrode is exposed from the first contact hole, and the second contact hole is defined through the first protection layer, so that a portion of the second electrode is exposed from the second contact hole.

Furthermore, in one or some embodiments, the ASIC further comprises a plurality of connection pad on the connection surface of the ASIC. Moreover, in one or some embodiments, in the via forming step, the via is defined through one of the connection pads.

In one or some embodiments, after the second protection layer forming step, the method further comprises a polishing step. The polishing step comprises polishing the wafer substrate in a direction from the second surface toward the first surface to reduce a thickness of the wafer substrate.

In one or some embodiments, the connecting step further comprises vacuuming the space.

As above, according to one or some embodiments of the instant disclosure, the first ultrasonic signals transmitted from the upper surface of the ultrasonic element travel through the transmitting material; while the second ultrasonic signals transmitted from the lower surface of the ultrasonic element travel through the space. Therefore, the transmission speed of the first ultrasonic signals is quite different from the transmission speed of the second ultrasonic signals. Furthermore, the ASIC is connected to the wafer substrate is electrically connected to the ultrasonic element. Hence, the structural strength of the wafer scale ultrasonic sensor assembly can be improved, and the ultrasonic signals can be recognized accurately and quickly.

BRIEF DESCRIPTION OF THE DRAWINGS

The disclosure will become more fully understood from the detailed description given herein below for illustration only, and thus not limitative of the disclosure, wherein.

DETAILED DESCRIPTION

Figure 1A:
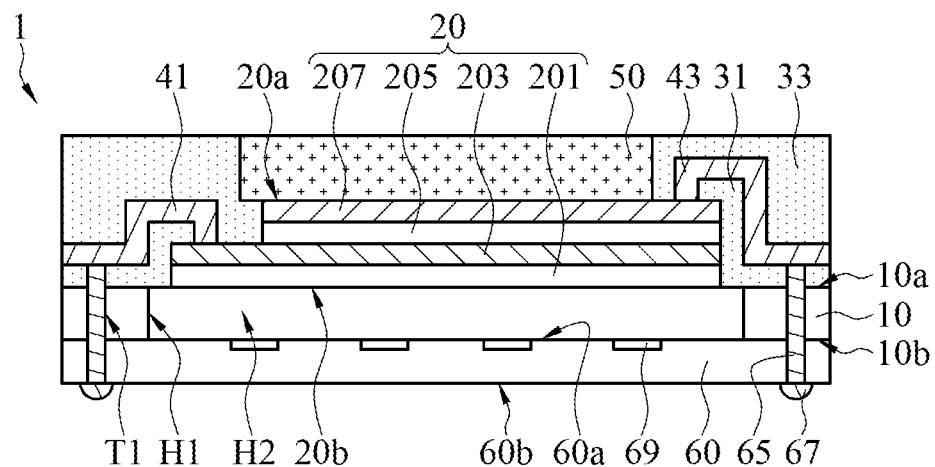
FIG. 1A illustrates a sectional view of a wafer scale ultrasonic sensor assembly according to a first embodiment of the instant disclosure.

FIG. 1A illustrates a sectional view of a wafer scale ultrasonic sensor assembly according to a first embodiment of the instant disclosure. As shown in FIG. 1A, the wafer scale ultrasonic sensor assembly (hereinafter, for convenience, the assembly 1) comprises a wafer substrate 10, an ultrasonic element 20, a first protection layer 31, a second protection layer 33, a first conductive wire 41, a second conductive wire 43, a transmitting material 50, an application-specific integrated circuit chip (hereinafter, the ASIC 60), a conductive pillar 65, and a soldering portion 67.

The wafer substrate 10 comprises a through groove H1. The through groove H1 is defined through a first surface 10a and a second surface 10b of the wafer substrate 10. The first surface 10a is opposite to the second surface 10b. As shown in FIG. 1A, the first surface 10a indicates the upper surface, and the second surface 10b indicates the lower surface; however, it is understood that, during the manufacturing process, the wafer substrate 10 may be flipped, and the orientation of the upper side and the lower side may be deflected or inversed. Moreover, the wafer substrate 10 may be a silicon wafer substrate, but embodiments are not limited thereto; the wafer substrate 10 may be a sapphire substrate, a gallium arsenide substrate, an aluminum arsenide substrate, etc.

The ultrasonic element 20 is on the first surface 10a of the wafer substrate 10, and the ultrasonic element 20 has an upper surface 20a and a lower surface 20b. The lower surface 20b of the ultrasonic element 20 is exposed from the through groove H1. The first protection layer 31 is on the first surface 10a of the wafer substrate 10 and surrounds the ultrasonic element 20. The first conductive wire 41 and the second conductive wire 43 are on the first protection layer 31 and respectively connected to the upper surface 20a of the ultrasonic element 20. The second protection layer 33 covers the first conductive wire 41 and the second conductive wire 43. The second protection layer 33 has an opening 35, the opening 35 is further defined through the first protection layer 31 and the second protection layer 33, and the upper surface 20a of the ultrasonic element 20 corresponds to the opening 35. In this embodiment, the first protection layer 31, the first conductive wire 41, and the second protection layer 33 may be a complex structure formed by stacked layers, and the first protection layer 31, the second conductive wire 43, and the second protection layer 33 may be a complex structure formed by stacked layers as well. In this embodiment, the first protection layer 31 and the second protection layer 33 may be, but not limited to, made of silicon dioxide ($SiO_2$).

The transmitting material 50 is in the opening 35 and contacts the upper surface 20a of the ultrasonic element 20. The ASIC 60 comprises a connection surface 60a and a bottom surface 60b opposite to the connection surface 60a. The connection surface 60a is connected to the second surface 10b of the wafer substrate 10, and the through groove H1 has a space H2 between the connection surface 60a of the ASIC 60 and the lower surface 20b of the ultrasonic element 20. The conductive pillar 65 is in a via T1 defined through the ASIC 60, the wafer substrate 10, and the first protection layer 31. The conductive pillar 65 is connected to the first conductive wire 41, the second conductive wire 43, or both the first conductive wire 41 and the second conductive wire 43. The soldering portion 67 is on the bottom surface 60b of the ASIC 60, and the soldering portion 67 is connected to the conductive pillar 65. In this embodiment, as shown in FIG. 1A, the assembly 1 comprises two conductive pillars 65, one conductive pillar 65 is connected to the first conductive wire 41, and the other conductive pillar 65 is connected to the second conductive wire 43; however, it is understood that the embodiment is provided for illustrative purposes, not a limitation. Furthermore, the transmitting material 50 may be polydimethylsiloxane (PDMS) and the soldering portion 67 may be solder balls; however, it is understood that the embodiment is provided for illustrative purposes, not a limitation.

As shown in FIG. 1A, in the assembly 1 of the first embodiment and the second embodiment, the ultrasonic element 20 comprises a first piezoelectric layer 201, a first electrode 203, a second piezoelectric layer 205, and a second electrode 207. The first piezoelectric layer 201, the first electrode 203, the second piezoelectric layer 205, and the second electrode 27 are stacked on the wafer substrate 10 sequentially. The second piezoelectric layer 205 and the second electrode 207 do not cover portions of an upper surface of the first electrode 203. In other words, areas of the first piezoelectric layer 201 and the first electrode 203 are slightly greater than areas of the second piezoelectric layer 205 and the second electrode 207, and the upper surface 20a of the ultrasonic element 20 may comprise the first electrode 203 and the second electrode 207. The transmitting material 50 contacts the second electrode 207, the first electrode 203 is connected to the first conductive wire 41, and the second electrode 207 is connected to the second conductive wire 43.

More specifically, in one embodiment, the first piezoelectric layer 201 and the second piezoelectric layer 205 may be made of aluminum nitride (AlN), zinc oxide (ZnO), or lead zirconate titanate (PZT). The first electrode 203 and the second electrode 207 may be made of aluminum (Al) tungsten (W), molybdenum (Mo), platinum (Pt), Gold (Au), etc. It is understood that, the embodiment is provided for illustrative purposes, not a limitation.

Figure 1B:
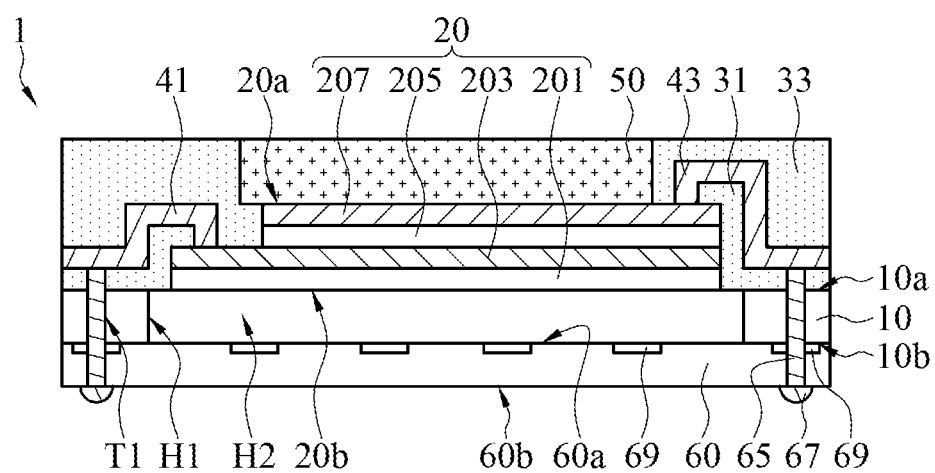
FIG. 1B illustrates a sectional view of a wafer scale ultrasonic sensor assembly according to a second embodiment of the instant disclosure.

FIG. 1B illustrates a sectional view of a wafer scale ultrasonic sensor assembly according to a second embodiment of the instant disclosure. As shown in FIG. 1B, the ASIC 60 of the assembly 1 in the second embodiment further comprises a plurality of connection pads 69 on the connection surface 60a of the ASIC 60. In the second embodiment, the via T1 is defined through one of the connection pads 69, and the conductive pillar 65 is connected to the connection pad 69 when the conductive pillar 65 is formed.

Figure 2A:
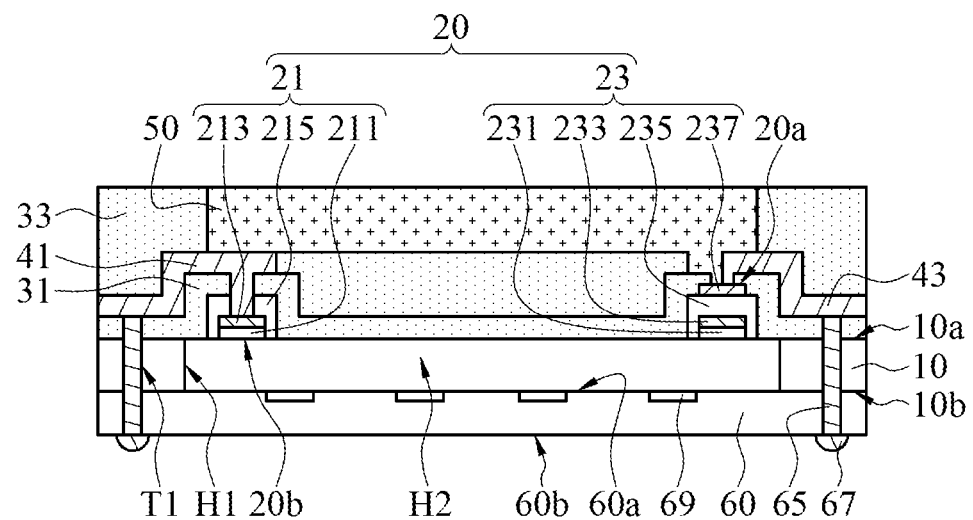
FIG. 2A illustrates a sectional view of a wafer scale ultrasonic sensor assembly according to a third embodiment of the instant disclosure.

FIG. 2A illustrates a sectional view of a wafer scale ultrasonic sensor assembly according to a third embodiment of the instant disclosure. As shown in FIG. 2A, in the third embodiment, the ultrasonic element 20 comprises a first ultrasonic unit 21 and a second ultrasonic unit 23. The first ultrasonic unit 21 and the second ultrasonic unit 23 are not overlapped with each other in a direction perpendicular to the first surface 10a of the wafer substrate 10; the first ultrasonic unit 21 and the second ultrasonic unit 23 are aligned parallel on a horizontal plane. The first ultrasonic unit 21 comprises a first electrode 213 and a first piezoelectric layer 215. The first piezoelectric layer 215 is on the wafer substrate 10. The first piezoelectric layer 215 and the first protection layer 31 have a first contact hole V1, so that the first piezoelectric layer 215 communicates with the first protection layer 31 through the first contact hole V1. The first electrode 213 is enclosed by the first piezoelectric layer 215, a portion of the first electrode 213 is exposed from the first contact hole V1, and a portion of the first conductive wire 41 is in the first contact hole V1 and connected to the first electrode 213. The second ultrasonic unit 23 comprises a second piezoelectric layer 235, a second circuit pattern layer 233, and a second electrode 237. The second piezoelectric layer 235 is on the wafer substrate 10. The first piezoelectric layer 215 and the second piezoelectric layer 235 are the same layer and separated from each other. The second circuit pattern layer 233 is enclosed by the second piezoelectric layer 235. The second circuit pattern layer 233 and the first electrode 213 are the same layer and separated from each other. The second electrode 237 is on the second piezoelectric layer 235. The first protection layer 31 further comprises a second contact hole V2 communicating with the opening 35. A portion of the second conductive wire 43 is in the second contact hole V2 and connected to the second electrode 237. A portion of the transmitting material 50 is filled in the second contact hole V2 and in contact with the second electrode 237. Furthermore, the bottom of the first electrode 213 comprises a first bottom piezoelectric layer 211, and the bottom of the second circuit pattern layer 233 comprises a second bottom piezoelectric layer 231. The first bottom piezoelectric layer 211 and the second bottom piezoelectric layer 231 are the same layer but separated from each other. The first bottom piezoelectric layer 211 is enclosed by the first piezoelectric layer 215, and the second bottom piezoelectric layer 231 is enclosed by the second piezoelectric layer 235.

Figure 2B:
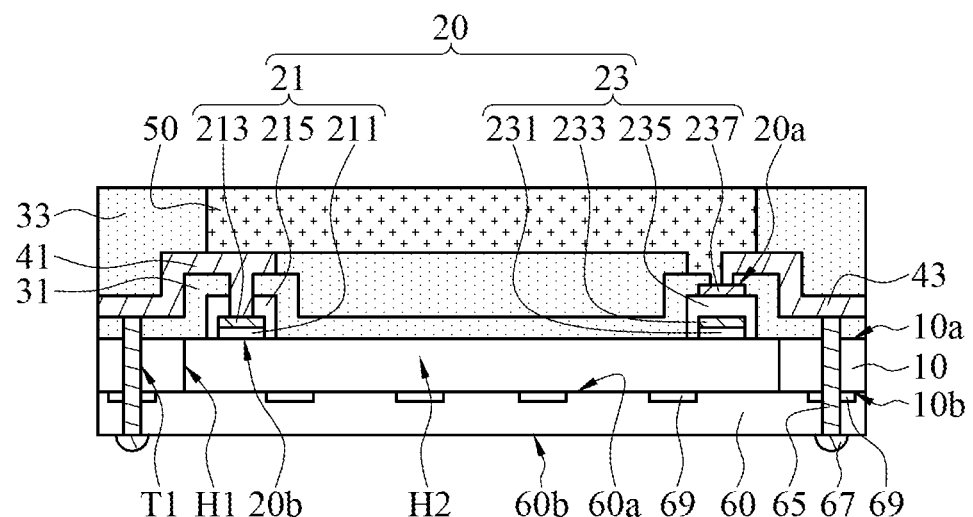
FIG. 2B illustrates a sectional view of a wafer scale ultrasonic sensor assembly according to a fourth embodiment of the instant disclosure.

FIG. 2B illustrates a sectional view of a wafer scale ultrasonic sensor assembly according to a fourth embodiment of the instant disclosure. In this embodiment, the ASIC 60 further comprises a plurality of connection pads 69, and the connection pads 69 are on the connection surface of the ASIC. The via T1 is defined through one of the connection pads 69, and the when the conductive pillar 65 is formed, the connection pad 69 having the via T1 is connected to the conductive pillar 65. In this embodiment, the connection pad 69 may be further provided as a target for controlling to form the via T1.

In such structure, the ultrasonic element 20 can be suspended above the space H2 between the connection surface 60a of the ASIC 60 and the lower surface 20b of the ultrasonic element 20. Therefore, the ultrasonic element 20 is more sensible to change of frequency and generates vibration according to change of frequency. Therefore, the ultrasonic signals transmitted by the ultrasonic element 20 from the upper surface 20a (hereinafter, first ultrasonic signals) are transmitted through solid mediums (the transmitting material 50, the first protection layer 31, and the second protection layer 33). On the other hand, the ultrasonic signals transmitted by the ultrasonic element 20 from the lower surface 20b (hereinafter, second ultrasonic signals) are transmitted through the wafer substrate 10, the ASIC 60, and the space H2. The second ultrasonic signals are transmitted through different mediums and reflected by different mediums. Therefore, the transmission speed of the first ultrasonic signals is different from the transmission speed of the second ultrasonic signals. Accordingly, the second ultrasonic signals can be identified and removed, so that the fingerprint recognition can be achieved by using the first ultrasonic signals without the interferences from the second ultrasonic signals. Hence, the accuracy of the fingerprint recognition can be improved.

Furthermore, the space H2 may be vacuumed. Therefore, because the vacuumed space H2 lacks of mediums, the second ultrasonic signals generated by the vibration of the ultrasonic element 20 are difficult to be transmitted through the vacuum space H2. Hence, the transmission speed of the first ultrasonic signals is further greater than the transmission speed of the second ultrasonic signals. Consequently, the interferences come from the second ultrasonic signals can be further reduced during the fingerprint recognition, thereby improving the accuracy for fingerprint recognition.

Furthermore, in some embodiments, the connection surface 60a of the ASIC 60 and the second surface 10b of the wafer substrate 10 are connected with each other directly through anodizing, rather than gluing. If the connection surface 60a of the ASIC 60 and the second surface 10b of the wafer substrate 10 are connected with each other through gluing, the fragments of the glue block the via T1 when the via T1 is formed. Conversely, when the connection surface 60a of the ASIC 60 and the second surface 10b of the wafer substrate 10 are connected with each other through anodizing, the via T1 is not blocked. Furthermore, by anodizing, the ASIC 60 and the wafer substrate 10 can be firmly connected with each other.

Figure 3A:
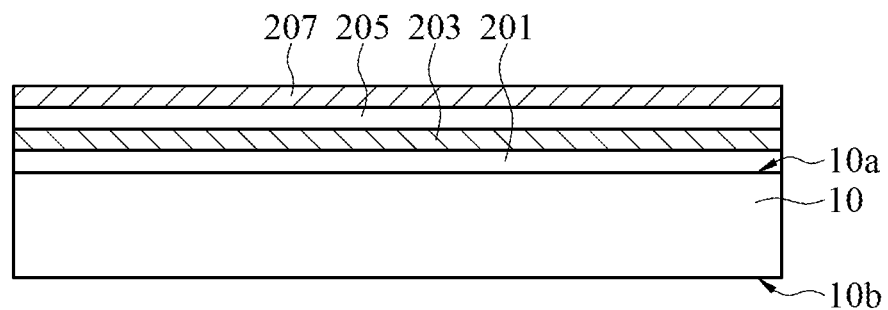
FIGS. 3A to 3O illustrate sectional views showing the steps corresponding to a method for manufacturing the wafer scale ultrasonic sensor assembly of the first embodiment.

A method for manufacturing the wafer scale ultrasonic sensor assembly 1 is also provided. The method comprises an ultrasonic element forming step, a first protection layer forming step, a wire connecting step, a second protection layer forming step, an opening forming step, a removing step, a connecting step, a via forming step, a via filling step, a soldering portion forming step, and a transmitting material filling step. FIGS. 3A to 3O illustrate sectional views showing the steps corresponding to the method for manufacturing the wafer scale ultrasonic sensor assembly of the first embodiment.

Figure 3B:
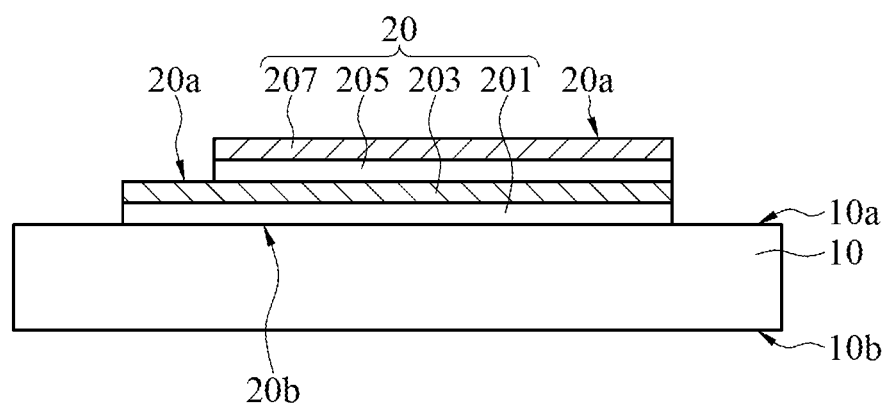
FIGS. 3J' to 3O' illustrate sectional views showing steps corresponding to a method for manufacturing the wafer scale ultrasonic sensor assembly of the second embodiment in which the steps are different from the method for manufacturing the wafer scale ultrasonic sensor assembly of the first embodiment.

As shown in FIGS. 3A and 3B, in the ultrasonic element forming step, an ultrasonic element 20 is formed on a first surface 10a of a wafer substrate 10. The ultrasonic element 20 comprises a first electrode 203 and a second electrode 207 not connected to the first electrode 203. As shown in FIG. 3A, a first piezoelectric layer 201, the first electrode 203, a second piezoelectric layer 205, and the second electrode 207 are sequentially formed on the wafer substrate 10. Next, as shown in FIG. 3B, a portion of the first piezoelectric layer 201, a portion of the first electrode 203, a portion of the second piezoelectric layer 205, and a portion of the second electrode 207 are removed. The second piezoelectric layer 205 and the second electrode 207 do not cover portions of an upper surface of the first electrode 203. In other words, the area of the first electrode 203 is greater than the area of the second piezoelectric layer 205 and the area of the second electrode 207.

Figure 3C:
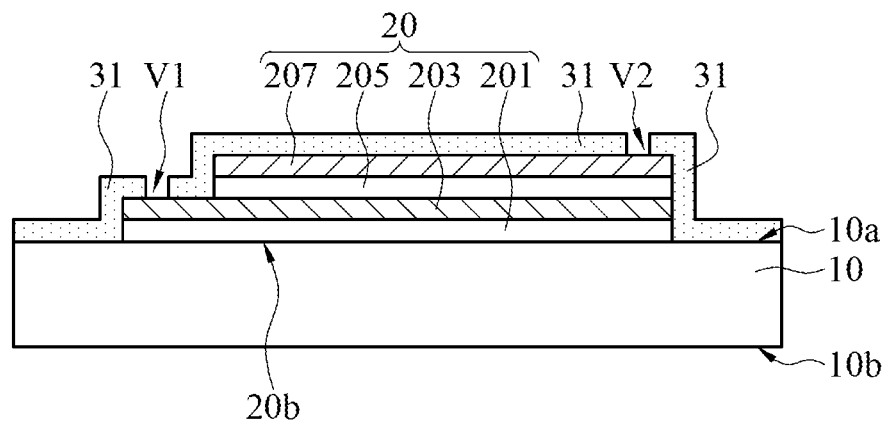

Next, as shown in FIG. 3C, in the first protection layer forming step, a first protection layer 31 is formed on an upper surface 20a of the ultrasonic element 20 and a first surface 10a of the wafer substrate 10. The first protection layer 31 has a first contact hole V1 and a second contact hole V2. A portion of the first electrode 203 is exposed from the first contact hole V1, and a portion of the second electrode 207 is exposed from the second contact hole V2. In this embodiment, regarding the formation of the first protection layer 31, a protection material layer may be formed using spin coating, spray coating, or roll coating. Then, the first contact hole V1 and the second contact hole V2 are formed on the protection material layer using photolithography or plasma ashing, so that the protection material layer becomes the first protection layer 31.

Figure 3D:
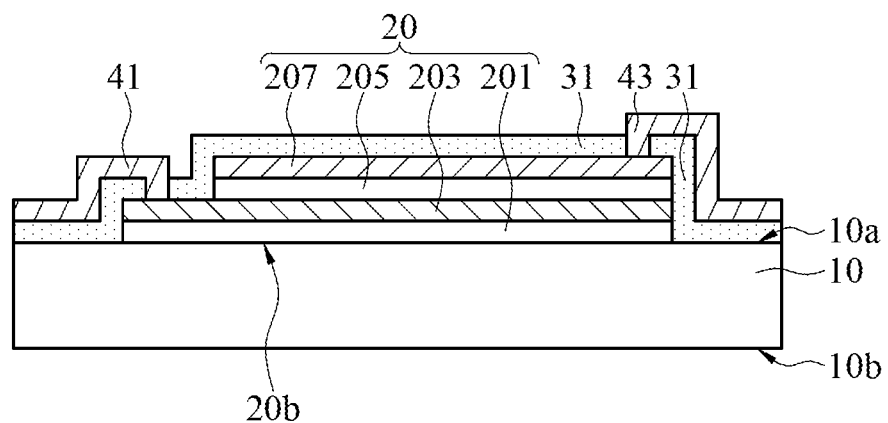

Next, as shown in FIG. 3D, in the wire connecting step, a first conductive wire 41 and a second conductive wire 43 is formed. The first conductive wire 41 and the second conductive wire 43 are on the first protection layer 31, portions of the first conductive wire 41 are in the first contact hole V1 and connected to the first electrode 203 of the ultrasonic element 20, and portions of the second conductive wire 43 are in the second contact hole V2 and connected to the second electrode 207 of the ultrasonic element 20. Regarding the formation of the first conductive wire 41 and the second conductive wire 43, a conductive material layer may be formed on the surface of the first protection layer 31 and filled into the first contact hole V1 and the second contact hole V2 using electroplating, evaporation, sputtering coating, or other ways. Next, the first conductive wire 41 and the second conductive wire 43 are separated from each other using photolithography or plasma ashing.

Figure 3E:
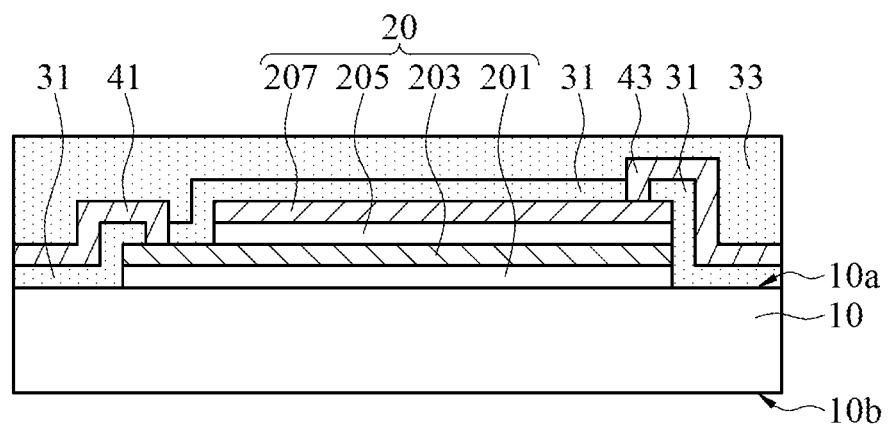
Figure 3F:
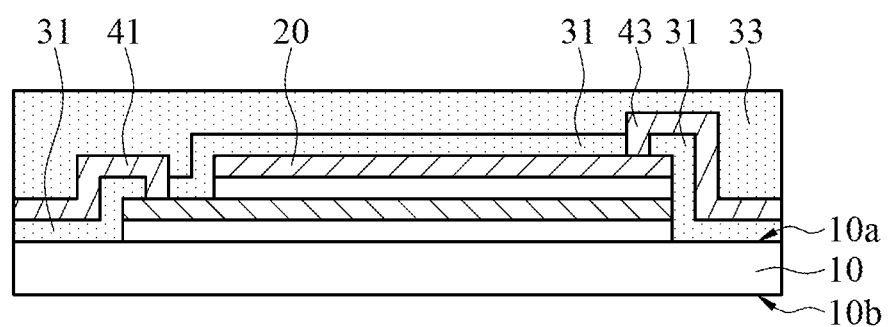

Then, as shown in FIG. 3E, in the second protection layer forming step, a second protection layer 33 is formed to cover the first conductive wire 41 and the second conductive wire 43. Furthermore, as shown in FIG. 3F, after the second protection layer forming step, the method may further comprise a polishing step. In the polishing step, the wafer substrate 10 is polished in a direction from the second surface 10b toward the first surface 10a to reduce a thickness of the wafer substrate 10.

Figure 3G:
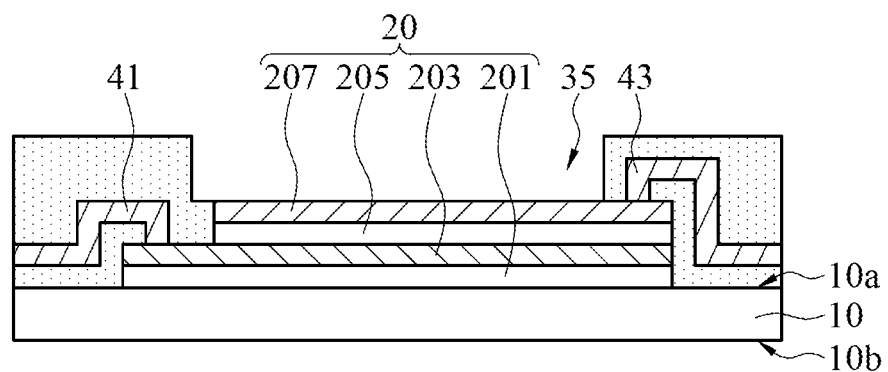
Figure 3H:
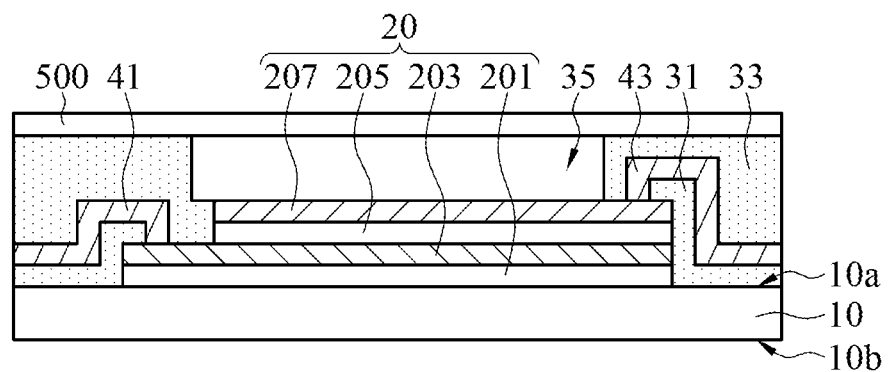
Figure 3I:
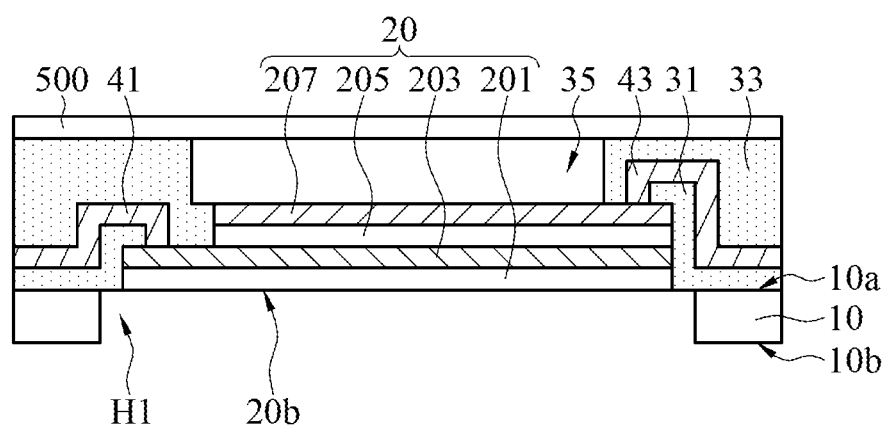

Please refer to FIGS. 3G to 3I. First, in the opening forming step, an opening 35 is formed on the first protection layer 31 and the second protection layer 33. The opening 35 at least exposes a portion of the second electrode 207. Next, in the removing step, as shown in FIG. 3I, a portion of the wafer substrate 10 is removed to form a through groove H1 defined through the first surface 10a and the second surface 10b, so that a lower surface 20b of the ultrasonic element 20 is exposed from the through groove H1. In some embodiments, the wafer substrate 10 may suffer a greater stress when a portion of the wafer substrate 10 is removed. In this case, as shown in FIG. 3, the method further comprises a loading plate covering step after the opening 35 is formed.

In the loading plate covering step, a loading plate 500 is covered on the second protection layer 33 and the opening 35 to shield the opening 35.

Figure 3J:
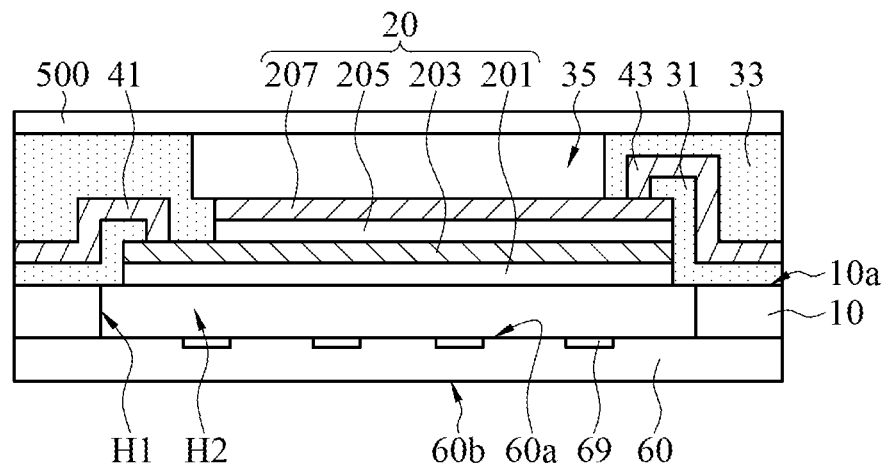
Figure 3J:
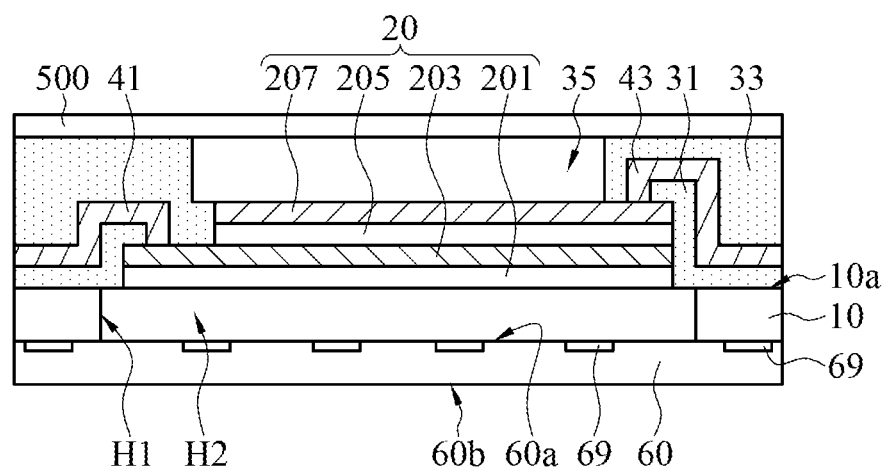

As shown in FIG. 3J, in the connecting step, a connection surface 60a of an ASIC 60 and the second surface 10b of the wafer substrate 10 are connected with each other through anodizing. Therefore, the through groove H1 has a space H2 between the connection surface 60a and the lower surface 20b. Through the anodizing techniques, the ASIC 60 and the wafer substrate 10 can be firmly connected with each other. Furthermore, glue contamination occurred by gluing connection can be avoided in the subsequent steps. Moreover, the ASIC 60 may be connected to the wafer substrate 10 through anodizing under a vacuum condition. Hence, the space H2 is vacuumed, thereby reducing the transmission speed of the second ultrasonic signals and improving the interference filtering.

Figure 3K:
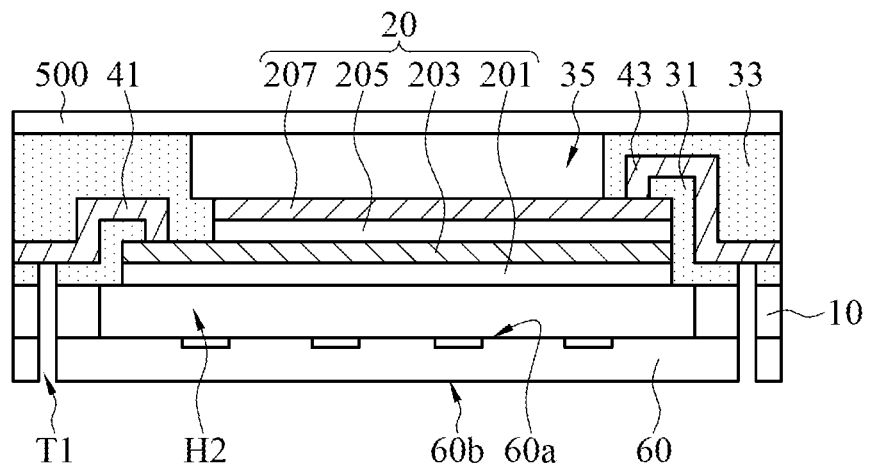
Figure 3K:
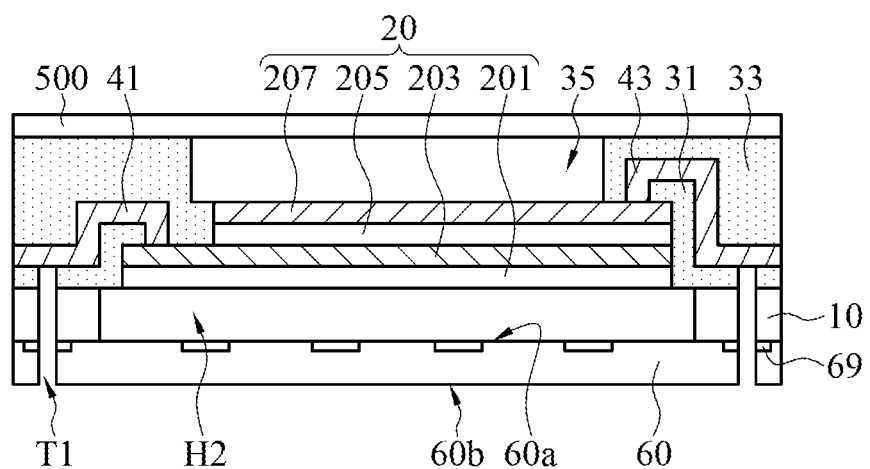
Figure 3L:
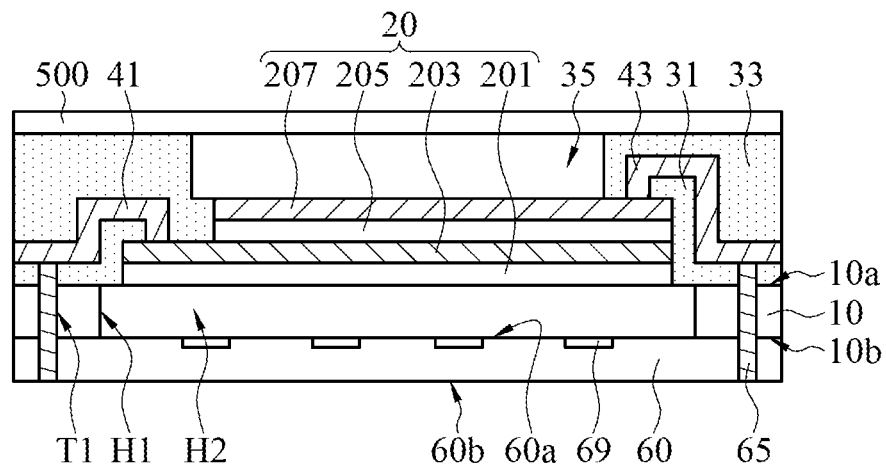
Figure 3L:
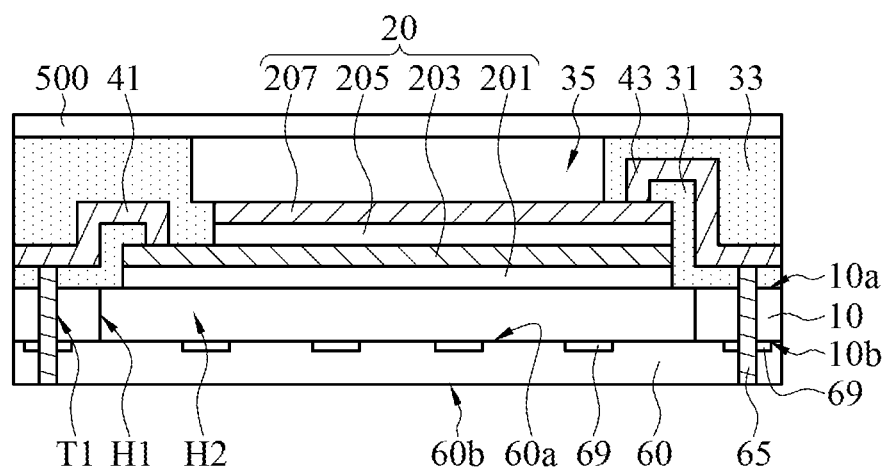
Figure 3M:
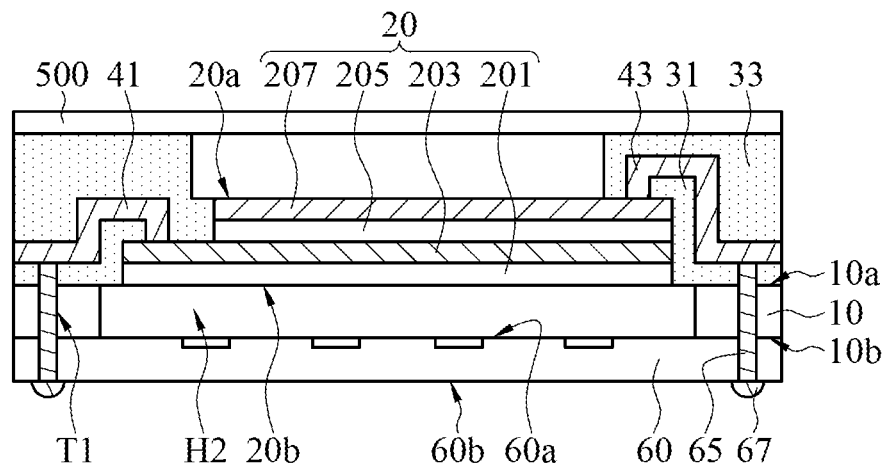
Figure 3M:
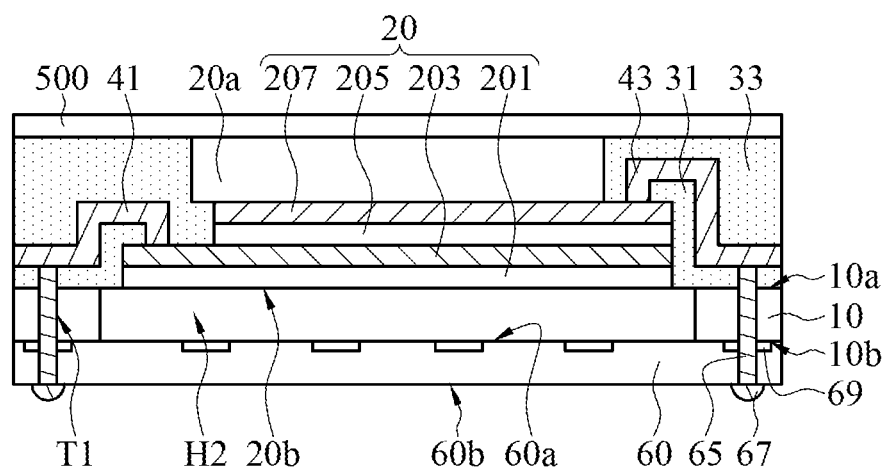

Please refer to FIGS. 3K to 3M. First, as shown in FIG. 3K, in the via forming step, a via T1 is formed using through-silicon via (TSV) or laser drilling, so that the via T1 is defined through the ASIC 60, the wafer substrate 10, and the first protection layer 31, but embodiments are not limited thereto. Next, as shown in FIG. 3L, in the via filling step, a conductive material is filled in the via T1 to form a conductive pillar 65. The conductive pillar 65 is connected to the first conductive wire 41 or the second conductive wire 43. In this embodiment, two vias T1 are formed, and the two vias T1 are filled with the conductive material to form two conductive pillars 65 respectively connected to the first conductive wire 41 and the second conductive wire 43. However, it is understood that the number of the via T1 is not limited. Next, as shown in FIG. 3M, in the soldering portion forming step, a soldering portion 67 is formed on a bottom surface 60b of the ASIC 60, a position of the soldering portion 67 corresponds to a position of the conductive pillar 65, and the soldering portion 67 is connected to the conductive pillar 65.

Figure 3N:
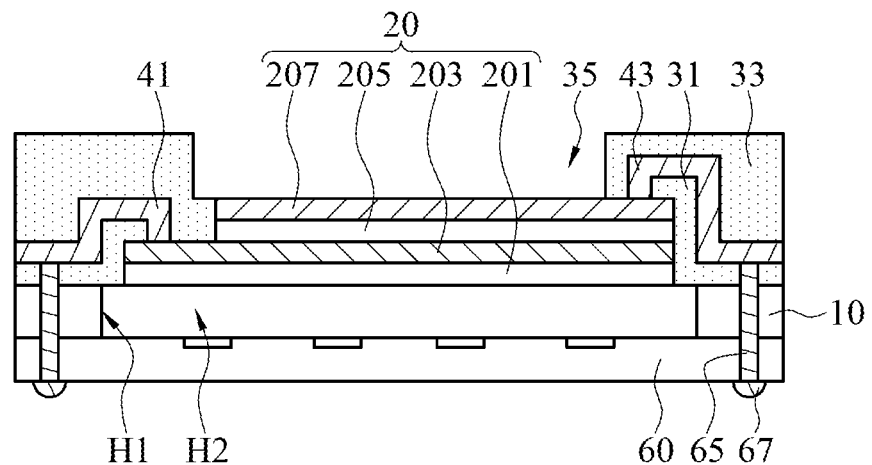
Figure 3N:
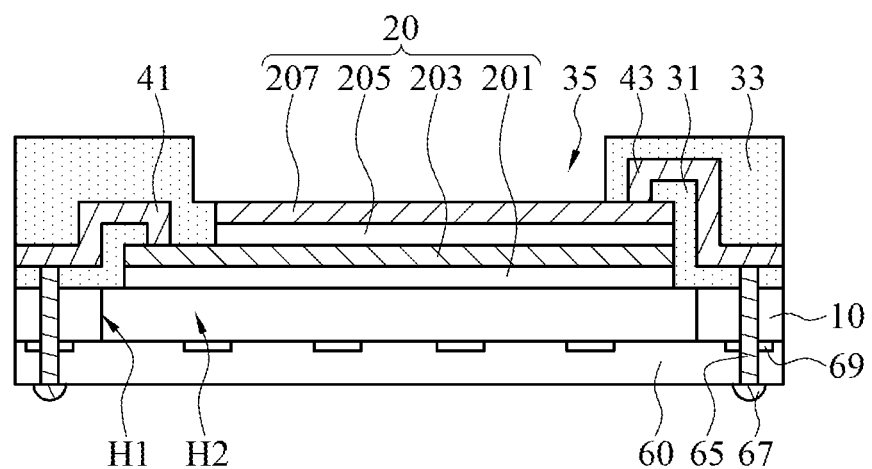
Figure 3O:
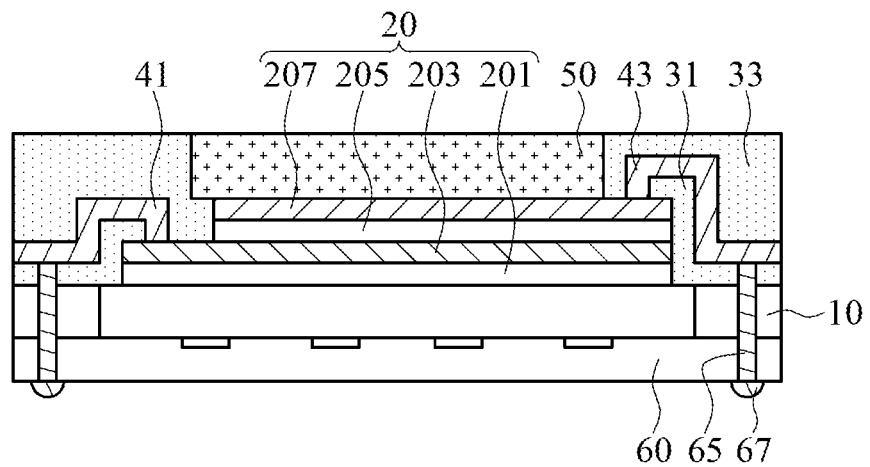
Figure 3O:
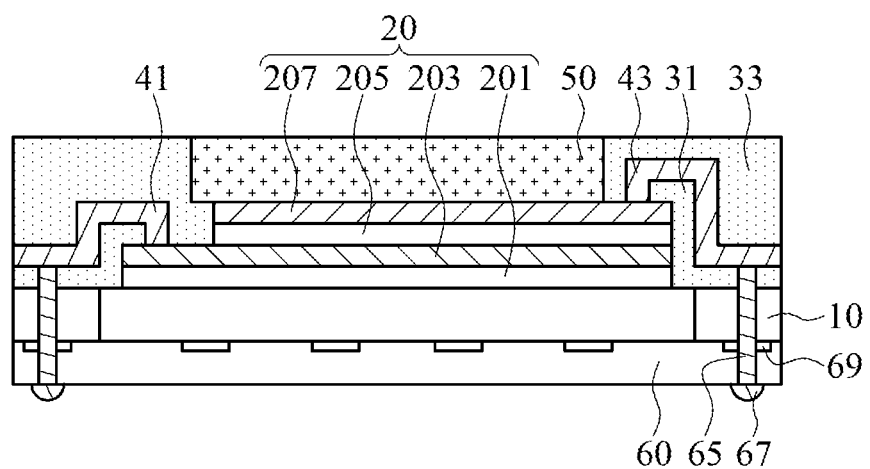

In the embodiment with the loading plate 500, after the soldering portion forming step is finished, the method further comprises a loading plate removing step, as shown in FIG. 3N. In the loading plate removing step, the loading plate 500 is removed to expose the opening 35. Last, as shown in FIG. 3O, in the transmitting material filling step, a transmitting material 50 is filled in the opening 35, and the transmitting material 50 contacts the upper surface 20a of the ultrasonic element 20. In detail, in one embodiment, the transmitting material 50 contacts the second electrode 207. Accordingly, the wafer scale ultrasonic sensor assembly of the first embodiment of the instant disclosure can be manufactured.

FIGS. 3J' to 3O' illustrate sectional views showing steps corresponding to a method for manufacturing the wafer scale ultrasonic sensor assembly of the second embodiment in which the steps are different from the method for manufacturing the wafer scale ultrasonic sensor assembly of the first embodiment. The steps shown in FIGS. 3A to 3I generally apply to the second embodiment, and descriptions for these steps of the second embodiment are thus omitted. As shown in FIG. 3J', the ASIC 60 in the second embodiment comprises a plurality of connection pads 69, and the connection pads 69 are on the connection surface 60a of the ASIC 69. As shown in FIG. 3K', in the via forming step, the via T1 is further defined through one of the connection pads 69.

In the via filling step, as shown in FIG. 3L', when the conductive material is filled in the via T1, the conductive material can contact portions of the connection pad 69 where the via T1 is not defined through. Namely, the connection pad 69 is connected to the conductive pillar 65 formed by the filled conductive material. As shown in FIGS. 3L' to 3O', the steps shown in FIGS. 3L' to 3O' are generally the same as the steps shown in FIGS. 3L to 3O, and descriptions for these steps of the second embodiment are thus omitted.

FIGS. 4A to 4H illustrate sectional views showing steps corresponding to a method for manufacturing the wafer scale ultrasonic sensor assembly of the third and fourth embodiments in which the steps are different from the method for manufacturing the wafer scale ultrasonic sensor assembly of the first embodiment. The major difference between the third embodiment and the first embodiment is the ultrasonic element 20 and the manufacture of the ultrasonic element 20. It is understood that, after the steps shown in FIG. 4A to 4H are applied, the steps shown in FIGS. 3F to 3O can be applied to manufacture the wafer scale ultrasonic sensor assembly, and detailed descriptions are thus omitted.

Figure 4A:
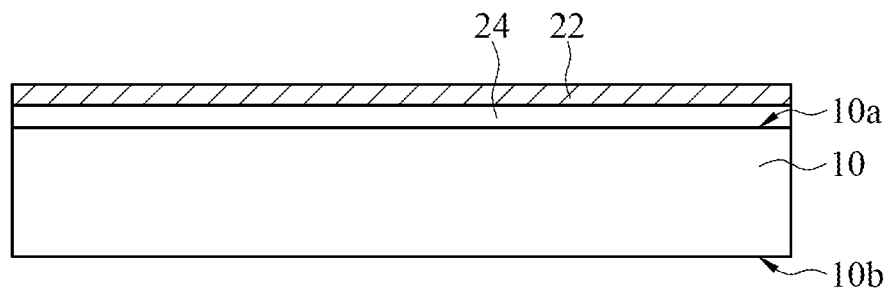
FIGS. 4A to 4H illustrate sectional views showing steps corresponding to a method for manufacturing the wafer scale ultrasonic sensor assembly of the third and fourth embodiments in which the steps are different from the method for manufacturing the wafer scale ultrasonic sensor assembly of the first embodiment.
Figure 4B:
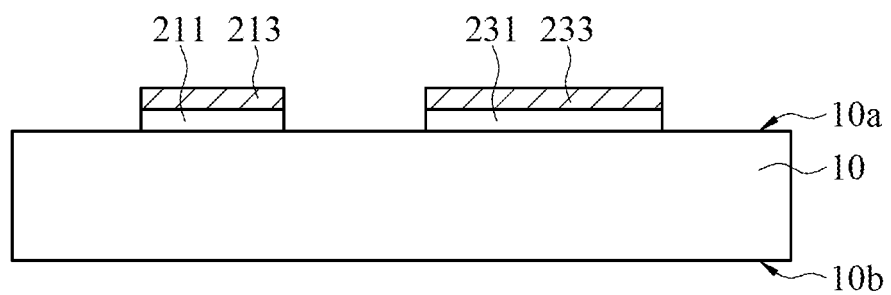
Figure 4C:
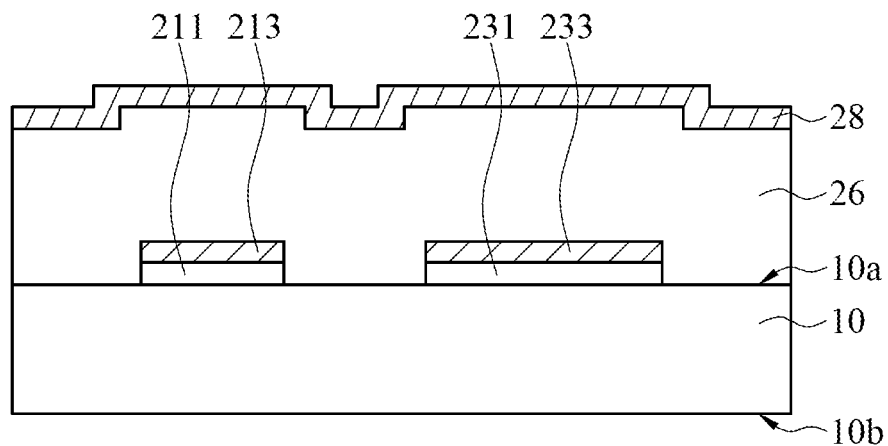
Figure 4D:
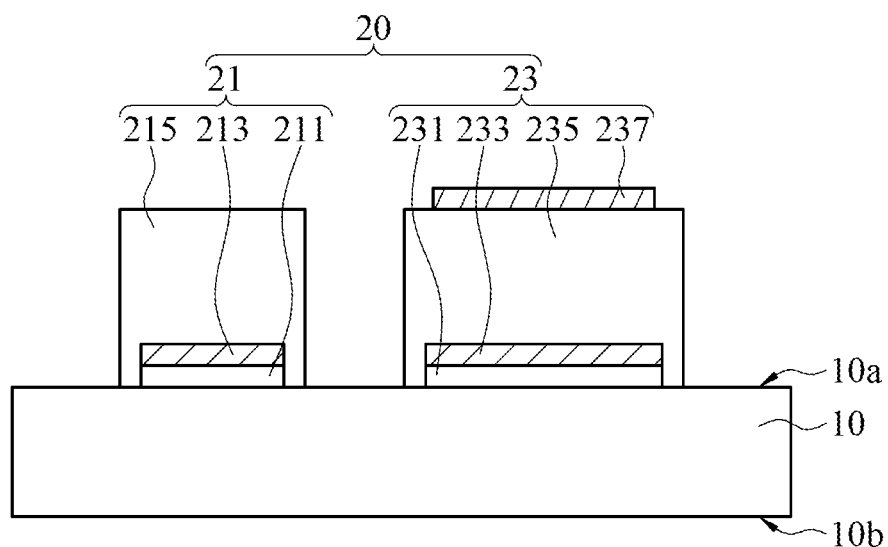

As shown in FIG. 4A, in the ultrasonic element forming step of the third embodiment, a first piezoelectric material layer 22 and a first electrode material layer 24 are sequentially formed on the wafer substrate 10. Next, as shown in FIG. 4B, the first piezoelectric material layer 22 and the first electrode material layer 24 are patterned to form a first bottom piezoelectric layer 211, a second bottom piezoelectric layer 231, a first electrode 213, and a second circuit pattern layer 233. The first bottom piezoelectric layer 211 and the second bottom piezoelectric layer 231 are separated from each other. The first electrode 213 is stacked on the first bottom piezoelectric layer 211, and the second circuit pattern layer 233 is stacked on the second bottom piezoelectric layer 231. Furthermore, as shown in FIG. 4C, a second piezoelectric material layer 26 and a second electrode material layer 28 on the first electrode 213 and the second circuit pattern layer 233 sequentially. Last, as shown in FIG. 4D, the second piezoelectric material layer 26 and the second electrode material layer 28 are patterned to form a first piezoelectric layer 215, a second piezoelectric layer 235, and a second electrode 237. The first piezoelectric layer 215 and the second piezoelectric layer 235 are separated from each other, and the second electrode 237 is formed on the second piezoelectric layer 235. In this embodiment, the first electrode 213 is enclosed by the first piezoelectric layer 215, and the second circuit pattern layer 233 is enclosed by the second piezoelectric layer 235.

Figure 4E:
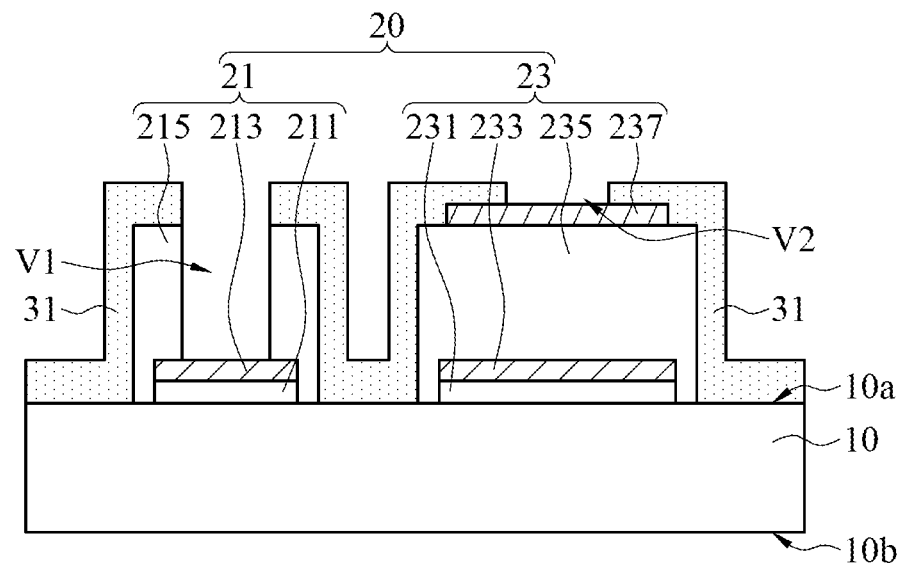

As shown in FIG. 4E, in the first protection layer forming step of the third embodiment, a first protection layer 31 is formed on the upper surface 20a of the ultrasonic element 20 and the first surface 10a of the wafer substrate 10. The first protection layer 31 has a first contact hole V1 and a second contact hole V2. In this embodiment, regarding the formation of the first protection layer 31, a protection material layer may be formed using spin coating, spray coating, or roller coating. Then, the first contact hole V1 and the second contact hole V2 may be formed using photolithography or plasma ashing, so that the protection material layer becomes the first protection layer 31.

Figure 4F:
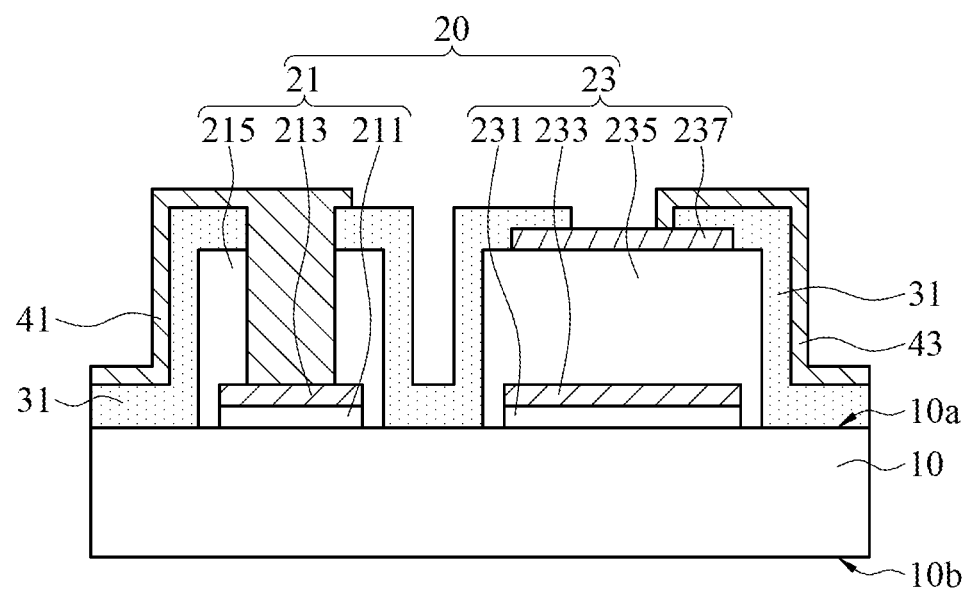

Next, as shown in FIG. 4F, in the wire connecting step, a first conductive wire 41 and a second conductive wire 43 are formed. The first conductive wire 41 and the second conductive wire 43 are on the first protection layer 31. Portion of the first conductive wire 41 are in the first contact hole V1 and connected to the first electrode 213 of the ultrasonic element 20, and portions of the second conductive wire 43 are in the second contact hole V2 and connected to the second electrode 237 of the ultrasonic element 20.

Figure 4G:
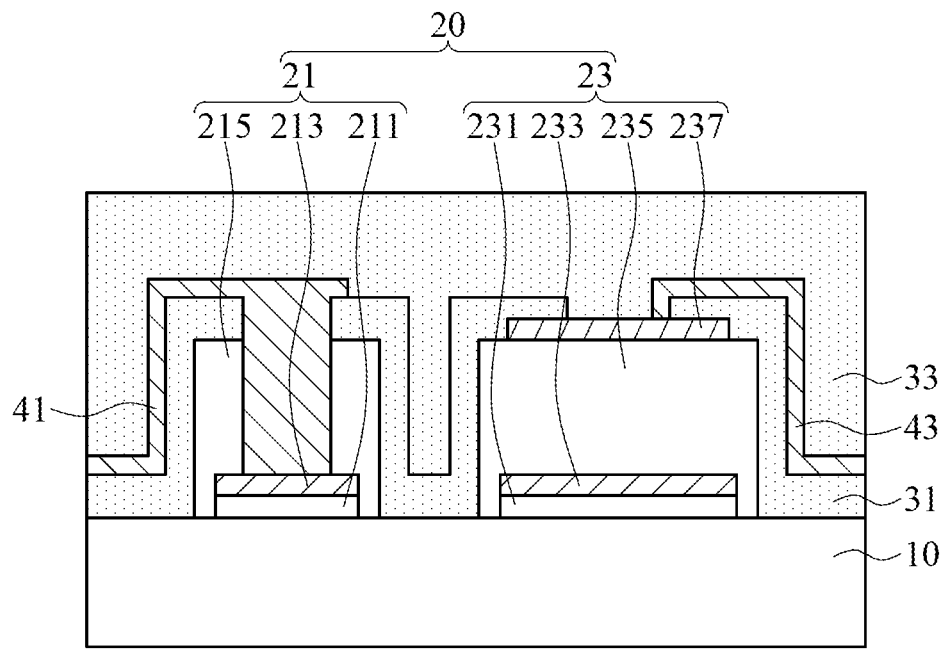
Figure 4H:
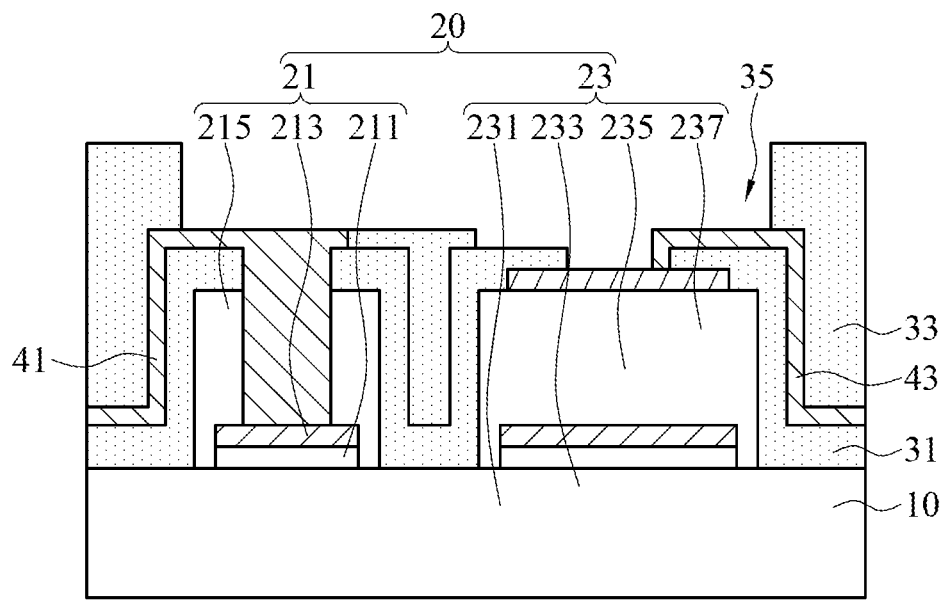

Next, as shown in FIG. 4G, in the second protection layer forming step, a second protection layer 33 is formed on the first protection layer 31, the first conductive wire 41, and the second conductive wire 43. The second protection layer 33 covers the first conductive wire 41 and the second conductive wire 43. Then, as shown in FIG. 4H, in the opening forming step, an opening 35 is formed on the second protection layer 33. The opening 35 at least exposes a portion of the second electrode 237. Next, by following the steps shown in FIGS. 3I to 3O, the wafer scale ultrasonic sensor assembly 1 according to the third embodiment of the instant disclosure can be manufactured. Alternatively, by following the steps shown in FIG. 3I and FIGS. 3J' to 3O', the wafer scale ultrasonic sensor assembly 1 according to the fourth embodiment of the instant disclosure can be manufactured. Descriptions for these steps of are omitted.

As above, according to one or some embodiments of the instant disclosure, the first ultrasonic signals transmitted from the upper surface 20a of the ultrasonic element 20 travel through the transmitting material 50; while the second ultrasonic signals transmitted from the lower surface 20b of the ultrasonic element 20 travel through the space H2. Therefore, the transmission speed of the first ultrasonic signals is quite different from the transmission speed of the second ultrasonic signals. Furthermore, the ASIC 60 is connected to the wafer substrate 10 is electrically connected to the ultrasonic element 20. Hence, the structural strength of the wafer scale ultrasonic sensor assembly 1 can be improved, and the ultrasonic signals can be recognized accurately and quickly.

While the instant disclosure has been described by the way of example and in terms of the preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A wafer scale ultrasonic sensor assembly, comprising:
a wafer substrate comprising a through groove penetrated through a first surface of the wafer substrate and a second surface of the wafer substrate, wherein the first surface is opposite to the second surface;
an ultrasonic element on the first surface of the wafer substrate, wherein the ultrasonic element has an upper surface and a lower surface, and the lower surface of the ultrasonic element is exposed from the through groove;
a first protection layer on the first surface of the wafer substrate and surrounding the ultrasonic element;
a first conductive wire and a second conductive wire on the first protection layer and respectively connected to the upper surface of the ultrasonic element;
a second protection layer covering the first conductive wire and the second conductive wire, wherein the second protection layer has an opening, and the upper surface of the ultrasonic element corresponds to the opening;
a transmitting material in the opening and contacting the upper surface of the ultrasonic element;
an application-specific integrated circuit chip (ASIC) comprising a connection surface and a bottom surface opposite to the connection surface, wherein the connection surface is connected to the second surface of the wafer substrate, and the through groove forms a space between the connection surface of the ASIC and the lower surface of the ultrasonic element;

a conductive pillar in a via defined through the ASIC, the wafer substrate, and the first protection layer, wherein the conductive pillar is connected to the first conductive wire or the second conductive wire; and a soldering portion on the bottom surface of the ASIC, wherein the soldering portion is connected to the conductive pillar.

2. The wafer scale ultrasonic sensor assembly according to claim 1, wherein the connection surface of the ASIC and the second surface of the wafer substrate are connected with each other directly through anodizing.

3. The wafer scale ultrasonic sensor assembly according to claim 1, wherein the ultrasonic element comprises a first piezoelectric layer, a first electrode, a second piezoelectric layer, and a second electrode stacked on the wafer substrate sequentially, wherein the second electrode does not cover portions of an upper surface of the first electrode, the transmitting material contacts the second electrode, the first electrode is connected to the first conductive wire, and the second electrode is connected to the second conductive wire.

4. The wafer scale ultrasonic sensor assembly according to claim 3, wherein the ASIC further comprises a plurality of connection pads on the connection surface of the ASIC.

5. The wafer scale ultrasonic sensor assembly according to claim 4, wherein the via is defined through one of the connection pads connected to the conductive pillar.

6. The wafer scale ultrasonic sensor assembly according to claim 1, wherein the ultrasonic element comprises a first ultrasonic unit and a second ultrasonic unit, wherein the first ultrasonic unit comprises a first piezoelectric layer and a first electrode; the first piezoelectric layer is on the wafer substrate, and the first piezoelectric layer and the first protection layer have a first contact hole, so that the first piezoelectric layer communicates with the first protection layer through the first contact hole; the first electrode is enclosed by the first piezoelectric layer, and a portion of the first conductive wire is in the first contact hole and connected to the first electrode; wherein the second ultrasonic unit is not overlapped with the first ultrasonic unit in a direction perpendicular to the first surface of the wafer substrate; the second ultrasonic unit comprises a second piezoelectric layer, a second circuit pattern layer, and a second electrode; the second piezoelectric layer is on the wafer substrate, and the first piezoelectric layer and the second piezoelectric layer are the same layer and separated from each other; the second circuit pattern layer is enclosed by the second piezoelectric layer, the second circuit pattern layer and the first electrode are the same layer and separated from each other, and the second electrode is on the second piezoelectric layer; the first protection layer has a second contact hole communicating with the opening, a portion of the second conductive wire is in the second contact hole and connected to the second electrode, and a portion of the transmitting material is in the second contact hole and contacting the second electrode.

7. The wafer scale ultrasonic sensor assembly according to claim 6, wherein the ASIC further comprises a plurality of connection pads on the connection surface of the ASIC.

8. The wafer scale ultrasonic sensor assembly according to claim 7, wherein the via is defined through one of the connection pads connected to the conductive pillar.

9. The wafer scale ultrasonic sensor assembly according to claim 1, wherein the transmitting material is polydimethylsiloxane.

10. A method for manufacturing wafer scale ultrasonic sensor assembly, comprising:

an ultrasonic element forming step: forming an ultrasonic element on a first surface of a wafer substrate, wherein the ultrasonic element comprises a first electrode and a second electrode not connected to the first electrode;

a first protection layer forming step: forming a first protection layer on an upper surface of the ultrasonic element and the first surface of the wafer substrate, wherein the first protection layer has a first contact hole and a second contact hole, a portion of the first electrode is exposed from the first contact hole, and a portion of the second electrode is exposed from the second contact hole;

a wire connecting step: forming a first conductive wire and a second conductive wire, wherein the first conductive wire and the second conductive wire are on the first protection layer, portions of the first conductive wire are in the first contact hole and connected to the first electrode of the ultrasonic element, and portions of the second conductive wire are in the second contact hole and connected to the second electrode of the ultrasonic element;

a second protection layer forming step: forming a second protection layer to cover the first conductive wire and the second conductive wire;

an opening forming step: forming an opening on the second protection layer, wherein the opening at least exposes a portion of the second electrode;

a removing step: removing a portion of the wafer substrate to form a through groove defined through the first surface and a second surface of the wafer substrate, wherein a lower surface of the ultrasonic element is exposed from the through groove, and the second surface is opposite to the first surface;

a connecting step: connecting a connection surface of an ASIC and the second surface of the wafer substrate through anodizing, so that the through groove has a space between the connection surface and the lower surface of the ultrasonic element;

a via forming step: forming a via defined through the ASIC, the wafer substrate, and the first protection layer;

a via filling step: filling a conductive material in the via to form a conductive pillar, wherein the conductive pillar is connected to the first conductive wire or the second conductive wire;

a soldering portion forming step: forming a soldering portion on a bottom surface of the ASIC, wherein a position of the soldering portion corresponds to a position of the conductive pillar, and the soldering portion is connected to the conductive pillar; and a transmitting material filling step: filling a transmitting material in the opening, wherein the transmitting material contacts an upper surface of the ultrasonic element.

11. The method according to claim 10, after the opening forming step further comprising a loading plate covering step: covering a loading plate on the second protection layer and the opening to shield the opening; after the soldering portion forming step further comprising a loading plate removing step: removing the loading plate to expose the opening.

12. The method according to claim 10, wherein the ultrasonic element forming step comprises:

forming a first piezoelectric layer, a first electrode, a second piezoelectric layer, and a second electrode on the wafer substrate sequentially; and removing a portion of the first piezoelectric layer, a portion of the first electrode, a portion of the second piezoelectric layer, and a portion of the second electrode, wherein the second piezoelectric layer and the second electrode do not cover portions of an upper surface of the first electrode, and in the opening forming step, the opening is further defined through the first protection layer.

13. The method according to claim 12, wherein the ASIC further comprises a plurality of connection pads on the connection surface of the ASIC.

14. The method according to claim 13, wherein in the via forming step, the via is defined through one of the connection pads.

15. The method according to claim 10, wherein the ultrasonic element forming step comprises:
    forming a first piezoelectric material layer and a first electrode material layer on the wafer substrate sequentially;
    patterning the first piezoelectric material layer and the first electrode material layer to form a first bottom piezoelectric layer, a second bottom piezoelectric layer, a first electrode, and a second circuit pattern layer, wherein the first bottom piezoelectric layer and the second bottom piezoelectric layer are separated from each other, the first electrode is stacked on the first bottom piezoelectric layer, and the second circuit pattern layer is stacked on the second bottom piezoelectric layer;
    forming a second piezoelectric material layer and a second electrode material layer on the first electrode and the second circuit pattern layer sequentially; and
    patterning the second piezoelectric material layer and the second electrode material layer to form a first piezoelectric layer, a second piezoelectric layer, and a second electrode, wherein the first piezoelectric layer and the second piezoelectric layer are separated from each other, the second electrode is formed on the second piezoelectric layer, wherein the first electrode is enclosed by the first piezoelectric layer, and the second circuit pattern layer is enclosed by the second piezoelectric layer.

16. The method according to claim 15, wherein the first protection layer forming step further comprise:
    forming a first protection material layer on the first piezoelectric layer, the second piezoelectric layer, and the second electrode; and
    forming the first contact hole and the second contact hole on the first protection material layer to convert the first protection material layer into the first protection layer, wherein the first protection layer comprises the first contact hole and the second contact hole, the first contact hole is defined through the first protection layer and the first piezoelectric layer, so that a portion of the first electrode is exposed from the first contact hole, and the second contact hole is defined through the first protection layer, so that a portion of the second electrode is exposed from the second contact hole.

17. The method according to claim 15, wherein the ASIC further comprises a plurality of connection pads on the connection surface of the ASIC.

18. The method according to claim 17, wherein in the via forming step, the via is defined through one of the connection pads.

19. The method according to claim 10, after the second protection layer forming step further comprising a polishing step: polishing the wafer substrate in a direction from the second surface toward the first surface to reduce a thickness of the wafer substrate.

20. The method according to claim 10, wherein the connecting step further comprises:
    vacuuming the space.

* * * * *